(12) United States Patent
Iijima

(10) Patent No.: US 9,196,456 B2
(45) Date of Patent: Nov. 24, 2015

(54) IMAGE ACQUISITION METHOD AND TRANSMISSION ELECTRON MICROSCOPE

(71) Applicant: JEOL Ltd., Tokyo (JP)

(72) Inventor: Hirofumi Iijima, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/509,402

(22) Filed: Oct. 8, 2014

(65) Prior Publication Data

US 2015/0136980 A1   May 21, 2015

(30) Foreign Application Priority Data

Oct. 22, 2013 (JP) .................... 2013-219239

(51) Int. Cl.
| | |
|---|---|
| *H01J 37/21* | (2006.01) |
| *H01J 37/22* | (2006.01) |
| *H01J 37/26* | (2006.01) |

(52) U.S. Cl.
CPC ............... *H01J 37/21* (2013.01); *H01J 37/226* (2013.01); *H01J 37/26* (2013.01); *H01J 37/263* (2013.01); *H01J 37/265* (2013.01); *H01J 2237/0492* (2013.01); *H01J 2237/10* (2013.01); *H01J 2237/1534* (2013.01); *H01J 2237/2007* (2013.01); *H01J 2237/21* (2013.01); *H01J 2237/2602* (2013.01); *H01J 2237/2614* (2013.01)

(58) Field of Classification Search
USPC ............................................ 250/311, 396 R
See application file for complete search history.

(56) References Cited

U.S. PATENT DOCUMENTS 8,071,954 B2 * 12/2011 Wagner et al. ............ 250/396 R
2006/0255273 A1 * 11/2006 Kasai et al. .................... 250/311

FOREIGN PATENT DOCUMENTS

JP             11135047 A    5/1999

* cited by examiner

*Primary Examiner* — Kiet T Nguyen
(74) *Attorney, Agent, or Firm* — The Webb Law Firm

(57) ABSTRACT

An image acquisition method and system for use in transmission electron microscopy and capable of providing information about a wide range of frequency range. The method is initiated with setting at least one of the spherical aberration coefficient and chromatic aberration coefficient of the imaging system of the microscope to suppress attenuation of a contrast transfer function due to an envelope function. Then, an image is obtained by the imaging system placed in defocus conditions.

4 Claims, 7 Drawing Sheets

IMAGE ACQUISITION METHOD AND TRANSMISSION ELECTRON MICROSCOPE

BACKGROUND OF THE INVENTION

1. Field of the Invention

The present invention relates to an image acquisition method and transmission electron microscope.

2. Description of Related Art

Generally, a transmission electron microscope (TEM) is required to have an imaging system that has a small spherical aberration coefficient $C_s$ for providing improved point resolution and a small chromatic aberration coefficient $C_c$ for providing improved lattice resolution (see, for example, JP-A-11-135047).

A point resolution of an objective lens is defined by the first zero of a contrast transfer function (CTF) at the Scherzer focus. As the spherical aberration coefficient $C_s$ decreases, the point resolution is improved. The first zero indicates a wave number at which the phase contrast transfer function at the Scherzer focus first crosses the axis of phase zero. The reciprocal of this wave number is the point resolution.

A contrast transfer function at the Scherzer focus is advantageous for providing improved point resolution and is important as a method for utilization in transmission electron microscopy that is applied to fields where tiny structures or objects of less than 1 nm are investigated and to the field of materials science where atomic resolutions better than 1 Å are required.

On the other hand, in the field of life science, objects or structures which are subjects of observation range widely in size from approximately 0.2 nm to as large as tens of nanometers. Information about these objects ranging widely in size is required. However, the optical system of a conventional transmission electron microscope cannot transmit information about low spatial frequencies and information about high spatial frequencies at the same time. It has been impossible to obtain information about objects ranging widely in size for the reason described below.

FIG. 10 is a graph showing a contrast transfer function at the Scherzer focus. The shown function has been derived as a result of a calculation performed under conditions where $C_s$=1.0 mm, $C_c$=2.0 mm, accelerating voltage V=200 kV, illumination angle α=0.1 mrad, and energy spread ΔE=0.8 eV.

FIG. 11 is a graph showing a contrast transfer function at a defocus of −2 μm. The shown function has been derived as a result of a calculation performed under conditions where $C_s$=1.0 mm, $C_c$=2.0 mm, accelerating voltage V=200 kV, illumination angle α=0.1 mrad, and energy spread ΔE=0.8 eV. Note that the negative sign "−" of the "defocus of −2 μm" denotes an underfocused condition.

As shown in FIG. 10, information about low spatial frequencies is little transferred at the Scherzer focus. Therefore, when structures or objects that are more than 1 nm in size are observed by phase contrast transmission electron microscopy, necessary information is not transferred at the Scherzer focus.

Accordingly, where relatively large microstructures are observed, the contrast transfer function is compressed by making the amount of defocus greater than the Scherzer focus value such that information about low spatial frequencies is obtained as shown in FIG. 11.

However, as the amount of defocus is increased, information about high spatial frequencies is impaired due to attenuation of the spatial envelope function as shown in FIG. 11. In this way, with the conventional optical system of a transmission electron microscope, it has been impossible to obtain information about low spatial frequencies and information about high spatial frequencies at the same time.

SUMMARY OF THE INVENTION

One object associated with some aspects of the present invention is to offer an image acquisition method capable of obtaining information about frequencies in a wide frequency range. Another object associated with some aspects of the invention is to offer a transmission electron microscope having an optical system capable of transferring information about frequencies in a wide frequency range.

(1) An image acquisition method associated with the present invention is for use in a transmission electron microscope, the method comprising the steps of: setting at least one of a spherical aberration coefficient and a chromatic aberration coefficient of an imaging system of the transmission electron microscope to suppress attenuation of a contrast transfer function due to an envelope function; and obtaining an image by the imaging system placed under defocus conditions.

In this image acquisition method, even if the amount of defocus is increased, attenuation of the contrast transfer function due to a spatial envelope function can be suppressed. Therefore, if the amount of defocus is increased, information about high spatial frequencies is not impaired. Consequently, information about low to high spatial frequencies in a wide frequency range can be obtained.

(2) In one feature of this image acquisition method, the spherical aberration coefficient of the imaging system may be set by the use of a spherical aberration corrector.

In this image acquisition method, the spherical aberration coefficient of the imaging system can be set easily. Therefore, the contrast transfer function can be easily varied such that the imaging system becomes adapted to the size of a structure or object under observation.

(3) In a further feature of this image acquisition method, the chromatic aberration coefficient of the imaging system may be set by the use of a chromatic aberration corrector.

In this image acquisition method, the chromatic aberration coefficient of the imaging system can be set easily. Accordingly, the contrast transfer function can be easily varied such that the imaging system becomes adapted to the size of the structure or object under observation.

(4) In an additional feature of this image acquisition method, the spherical aberration coefficient of the imaging system may be set to 10 mm or more, and the chromatic aberration coefficient of the imaging system may be set to 2 mm or less.

According to this image acquisition method, even if the amount of defocus is increased, attenuation of the contrast transfer function due to the spatial envelope function can be suppressed. Accordingly, if the amount of defocus is increased, information about high spatial frequencies is not impaired. Information about low to high spatial frequencies in a wide frequency range can be obtained.

(5) A transmission electron microscope associated with the present invention has: an electron beam source for producing an electron beam; an illumination system for causing the electron beam released from the electron beam source to be directed at a sample; an imaging system for focusing the electron beam transmitted through the sample; a spherical aberration corrector for varying a spherical aberration coefficient of the imaging system; and a controller for controlling the imaging system and the spherical aberration corrector. The controller performs an operation for controlling the spherical aberration corrector to set the spherical aberration coefficient of the imaging system such that attenuation of a contrast transfer function due to an envelope function is suppressed and an operation for controlling the imaging system to place the imaging system under defocus conditions.

In this transmission electron microscope, if the amount of defocus is increased, attenuation of the contrast transfer function due to the spatial envelope function can be suppressed. Accordingly, if the amount of defocus is increased, information about high spatial frequencies is not impaired. An optical system capable of transferring information about low to high spatial frequencies in a wide frequency range can be accomplished.

(6) Another transmission electron microscope associated with the present invention has: an electron beam source for producing an electron beam; an illumination system for causing the electron beam released from the electron beam source to be directed at a sample; an imaging system for focusing the electron beam transmitted through the sample; a chromatic aberration corrector for varying a chromatic aberration coefficient of the imaging system; and a controller for controlling the imaging system and the chromatic aberration corrector. The controller performs an operation for controlling the chromatic aberration corrector to set the chromatic aberration coefficient of the imaging system such that attenuation of a contrast transfer function due to an envelope function is suppressed and an operation for controlling the imaging system to place the imaging system under defocus conditions.

In this transmission electron microscope, even if the amount of defocus is increased, attenuation of the contrast transfer function due to a spatial envelope function can be suppressed. Accordingly, even if the amount of defocus is increased, information about high spatial frequencies is not impaired. An optical system capable of transferring information about low to high spatial frequencies in a wide frequency range can be accomplished.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment 1.1. Transmission Electron Microscope

Figure 1:
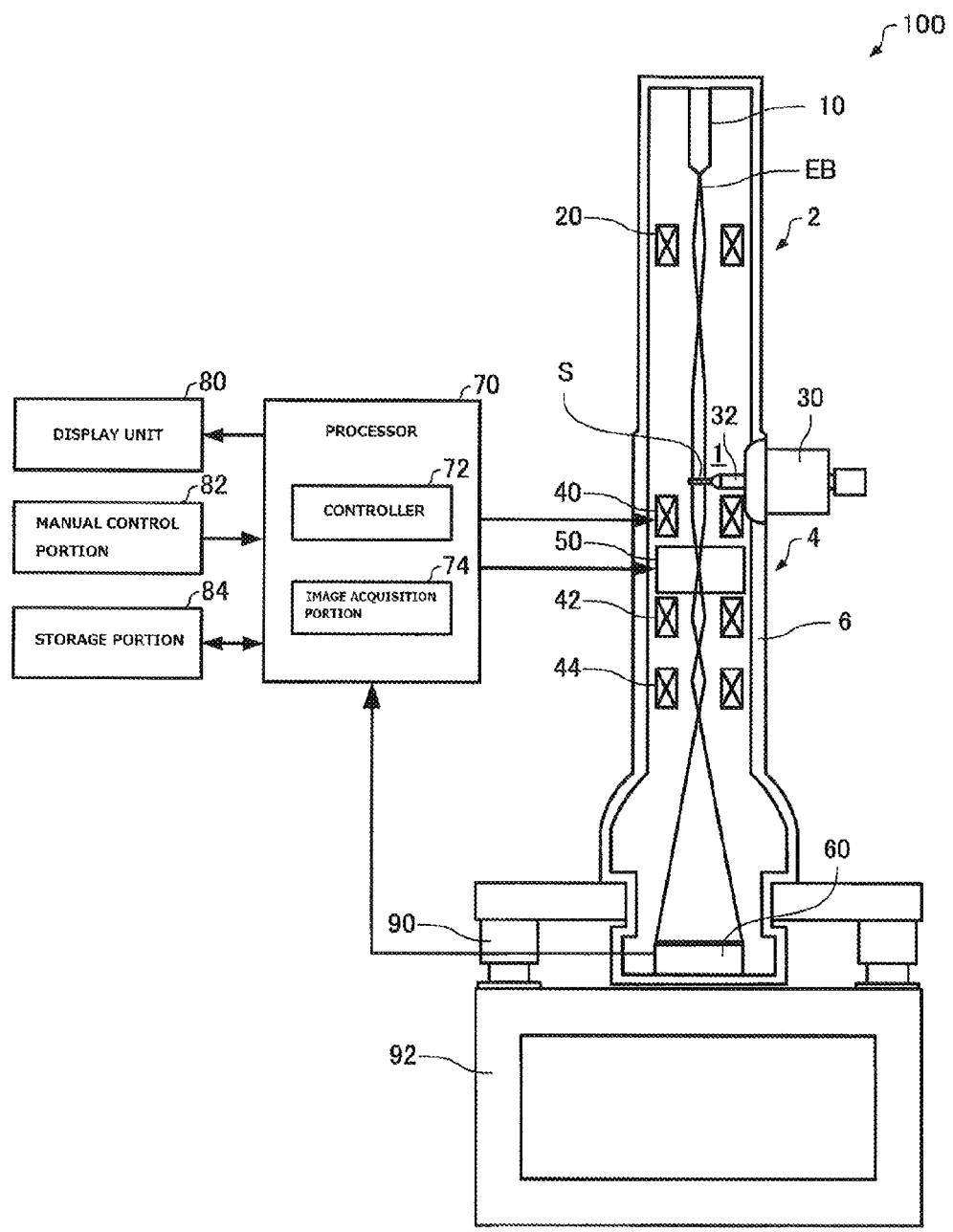
FIG. 1 is a vertical cross section partly in block form of a transmission electron microscope associated with a first embodiment of the present invention.

A transmission electron microscope associated with a first embodiment of the present invention is first described by referring to FIG. 1, which shows the configuration of the transmission electron microscope, 100.

As shown in FIG. 1, the transmission electron microscope 100 is configured including an electron beam source 10, an illumination system 2 (having an illumination lens system), a sample stage 30, an imaging system 4 (having an imaging lens system), a spherical aberration corrector 50, an image pickup device 60, a processor 70, a display unit 80, a manual control portion 82, and a storage portion 84. In the condition shown in FIG. 1, a sample holder 32 is inserted in a sample chamber 1.

The transmission electron microscope 100 including the illumination system 2 and the imaging system 4 further includes an optical system accommodated within an optical column 6. The interior of the optical column 6 is pumped down by vacuum pumping equipment (not shown).

The electron beam source 10 produces an electron beam EB by accelerating electrons released from a cathode by anodes. A well-known electron gun can be used as the electron beam source 10. No restrictions are imposed on the electron gun used as the electron beam source 10. For example, a thermionic electron gun, thermal field emission electron gun, cold field emission gun, or the like can be used.

The illumination system 2 of the transmission electron microscope 100 is used such that the electron beam EB released from the electron beam source 10 is directed at a sample S. In the illustrated example, the illumination system 2 is configured including illumination lenses (condenser lenses) 20. The illumination system 2 may further include a condenser minilens (not shown).

The illumination lenses 20 are disposed behind (on the downstream side as viewed along the electron beam EB) the electron beam source 10. The illumination lenses 20 are used to cause the electron beam EB generated by the electron beam source 10 to be directed at the sample S. The illumination lenses 20 may be arranged in plural stages in an unillustrated manner.

The sample stage 30 places the sample S in position within the sample chamber 1. The sample stage 30 can move the sample S within the sample chamber 1, the sample S being held on the sample holder 32. The sample S held on the sample holder 32 is irradiated with the electron beam EB in the sample chamber 1.

The sample stage 30 can horizontally move the sample S, move it up and down, rotate it, tilt it, or otherwise drive it. In the illustrated example, the sample stage 30 is a side-entry stage for inserting the sample holder 32 from a side of an objective lens 40.

The imaging system 4 of the transmission electron microscope 100 is used to bring the electron beam EB transmitted through the sample S into focus. The imaging system 4 is configured including the objective lens 40, an intermediate lens 42, and a projector lens 44.

The objective lens 40 is disposed behind the illumination lenses 20. The objective lens 40 is an initial stage of lens for bringing the electron beam EB transmitted through the sample S into focus. In the transmission electron microscope 100, the spherical aberration coefficient $C_s$ of the objective lens 40 is approximately 1.0 mm, for example. The chromatic aberration coefficient $C_c$ of the objective lens 40 is approximately 2.0 mm. No restrictions are placed on the value of the spherical aberration coefficient $C_s$ of the objective lens 40. Also, no restrictions are imposed on the value of the chromatic aberration coefficient $C_c$ of the objective lens 40. Preferably, the chromatic aberration coefficient $C_c$ is a small value between 0 mm and 2.0 mm, inclusively, for the reason described below.

The intermediate lens 42 is disposed behind the objective lens 40. The projector lens 44 is disposed behind the intermediate lens 42. The intermediate lens 42 and projector lens 44 operate to further magnify the electron microscope image focused by the objective lens 40 and to focus the magnified image onto the image pickup device 60.

The spherical aberration corrector (also known as a $C_s$ corrector) 50 is disposed behind the objective lens 40. In the illustrated example, the spherical aberration corrector 50 is arranged between the objective lens 40 and the intermediate lens 42. The spherical aberration corrector 50 is mounted in the imaging system 4 of the transmission electron microscope 100.

The spherical aberration corrector 50 changes the spherical aberration coefficient $C_s$ of the imaging system 4 of the transmission electron microscope 100. In the illustrated example, the corrector 50 varies the spherical aberration coefficient $C_s$ of the objective lens 40. The spherical aberration corrector 50 is configured, for example, including a multipole lens. The spherical aberration corrector 50 produces spherical aberration by means of the multipole lens to reduce or increase the spherical aberration coefficient $C_s$ of the objective lens 40. In particular, the spherical aberration corrector 50 produces negative spherical aberration to reduce the spherical aberration coefficient $C_s$ of the objective lens 40. Furthermore, the spherical aberration corrector 50 produces positive spherical aberration to increase the spherical aberration coefficient $C_s$ of the objective lens 40.

The image pickup device 60 picks up the TEM image focused by the imaging system 4. The image pickup device 60 includes a detector for detecting the electron beam EB. For example, the detector is a CCD camera having a two-dimensional array of solid-state imaging elements. The image pickup device 60 outputs information about the captured TEM image to the processor 70.

The display unit 80 displays the results of processing performed by the processor 70 as an image, graph, or other kind of information, based on a display signal entered from the processor 70. For instance, the display unit 80 displays a TEM image taken by an image acquisition portion 74. The display unit 80 is a CRT, LCD, touch panel display, or the like.

The manual control portion 82 obtains a manual control signal responsive to a user's operation and sends a signal to the processor 70. The manual control portion 82 is made of buttons, keys, a touch panel display, a microphone, or the like.

Programs and data permitting the processor 70 to perform various kinds of calculations and control operations are stored in the storage portion 84. Furthermore, the storage portion 84 is used as a working area for the processor 70. A manual control signal entered from the manual control portion 82 and the results of calculations executed by the processor 70 in accordance with various programs are temporarily stored in the storage portion 84. The function of the storage portion 84 can be implemented by hardware such as a RAM (random access memory).

The processor 70 as consisting of a CPU performs various computational operations in accordance with programs stored in the storage portion 84. The processor 70 acts as a controller 72 and an image acquisition portion 74 described below by executing the programs stored in the storage portion 84. Note that at least a part of the processor 70 may be implemented in hardware (dedicated hardware circuitry).

The controller 72 controls both the imaging system 4 of the transmission electron microscope 100 including the objective lens 40 and the spherical aberration corrector 50. In particular, the controller 72 controls the corrector 50 to set the spherical aberration coefficient $C_s$ of the imaging system 4 including the objective lens 40, for suppressing attenuation of a contrast transfer function due to an envelope function. Furthermore, the controller 72 operates such that the imaging system 4 of the microscope 100 including the objective lens 40 is placed under defocus conditions. These operations will be described in detail later.

Furthermore, the controller 72 may control the illumination lenses 20, sample stage 30, intermediate lens 42, projector lens 44, image pickup device 60, and other components.

The image acquisition portion 74 obtains information about each transmission electron microscope (TEM) image from the image pickup device 60. The image acquisition portion 74 generates a TEM image based on the obtained information about the TEM image. The image acquisition portion 74 generates a display signal from the generated image and displays the TEM image on the display unit 80.

In the illustrated example, the transmission electron microscope 100 is mounted on a pedestal 92 via vibration insulators 90.

1.2. Image Acquisition Method

An image acquisition method implemented in the transmission electron microscope associated with the first embodiment is next described. First, the principle of this image acquisition method is described.

In a transmission electron microscope, a contrast transfer function CTF of a weak phase object is set forth as follows.

$$CTF(\kappa) = E_s(\kappa)E_c(\kappa)\sin(\gamma(\kappa)) \quad (1)$$

$$\gamma(\kappa) = \frac{\pi}{2}C_s\lambda^3\kappa^4 + \pi\Delta f\lambda\kappa^2 \quad (2)$$

$$E_s(\kappa) = \exp\left[-\left(\frac{\pi\alpha}{\lambda}\right)^2(C_s\lambda^3\kappa^3 + \Delta f\lambda\kappa)^2\right] \quad (3)$$

$$E_c(\kappa) = \exp\left[-\frac{1}{2}\left(\pi\lambda C_c\frac{\Delta E}{V}\right)^2\kappa^4\right] \quad (4)$$

where $\gamma(\kappa)$ is an aberration function, $E_s(\kappa)$ is a spatial envelope function, and $E_c(\kappa)$ is a temporal envelope function. Variables contained in Eqs. (1)-(4) correspond to the following physical amounts.

κ: spatial frequency
λ: electron wavelength
V: accelerating voltage
$C_s$: spherical aberration coefficient
$C_c$: chromatic aberration coefficient
Δf: amount of defocus
α: illumination angle
ΔE: energy spread If the optical system is a completely excessively interfering optical system, the contrast transfer function CTF is given as follows and information about infinitely high spatial frequency is transmitted.

$$CTF(\kappa) = \sin(\gamma(\kappa))$$

However, the contrast transfer function CTF can transmit only information about finite spatial frequencies because of $E_s(\kappa)$ indicative of spatial incoherence and $E_c(\kappa)$ indicative of temporal incoherence.

Figure 11:
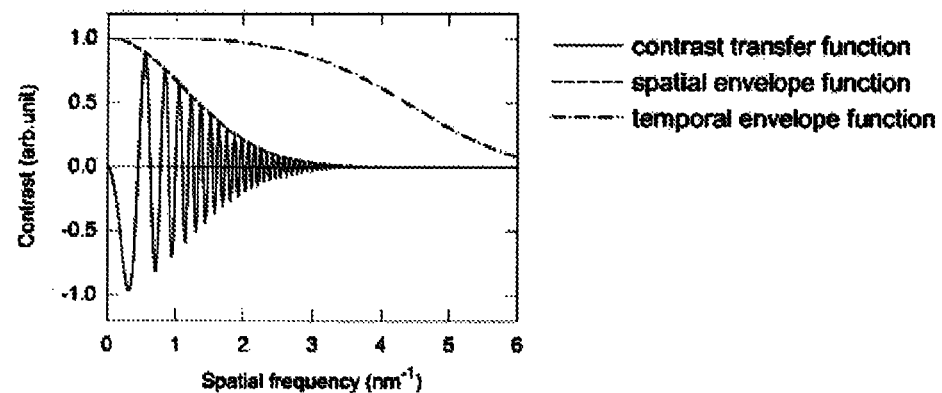
FIG. 11 is a graph showing a contrast transfer function at a defocus at −2 μm under conditions where $C_s=1.0$ mm, $C_c=2.0$ mm, V=200 kV, $\alpha=0.1$ mrad, and $\Delta E=0.8$ eV.

Increasing the amount of defocus toward the underfocus side is equivalent to increasing the amount of defocus Δf contained in the spatial envelope function $E_s(\kappa)$ of Eq. (3) in the negative direction. In a general transmission electron microscope, the spherical aberration coefficient $C_s$ is in the neighborhood of 1.0 mm and the chromatic aberration coefficient $C_c$ is approximately 2.0 mm. Therefore, if the amount of defocus is increased, information about high spatial frequencies is impaired due to attenuation of the contrast transfer function CTF caused by the spatial envelope function as shown in FIG. 11.

In the present embodiment, the imaging system 4 is accomplished which can transmit from information about low spatial frequencies to information about high spatial frequencies without impairing information about high spatial frequencies even if the amount of defocus is made greater than the Scherzer focus value by building the imaging system 4 in which only the spherical aberration coefficient $C_s$ is large by the use of the spherical aberration corrector 50, i.e., the spherical aberration coefficient $C_s$ is large but the chromatic aberration coefficient $C_c$ is small (e.g., $C_s \geq 10$ mm and $C_c \leq 2.0$ mm).

As described previously, if the amount of defocus Δf of Eq. (3) increases in the negative direction, the amount of attenuation of the contrast transfer function CTF at high spatial frequencies due to the spatial envelope function increases as shown in FIG. 11. However, if the spherical aberration coefficient $C_s$ is large and the chromatic aberration coefficient $C_c$ of the imaging system 4 is small, a balance is struck between the amount of attenuation and the amount of defocus. Hence, even at high spatial frequencies, information is not lost.

Figure 2:
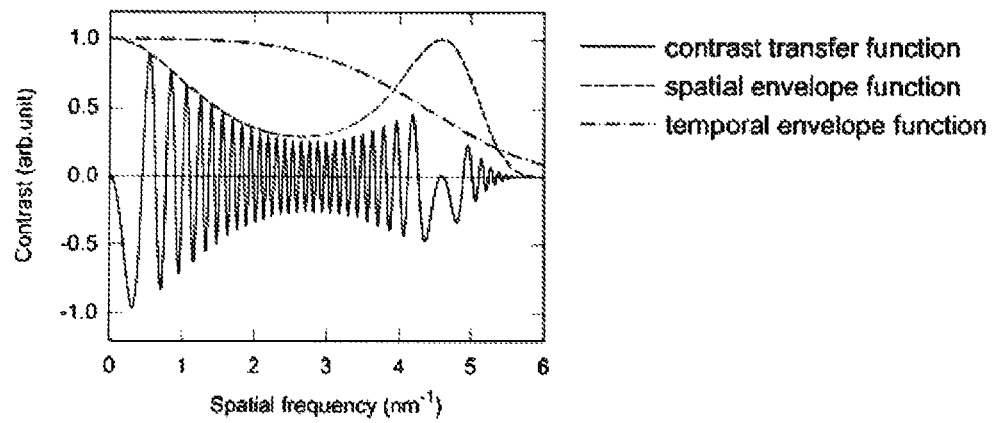
FIG. 2 is a graph showing a contrast transfer function at a defocus of −2 μm under conditions where $C_s=15$ mm, $C_c=2.0$ mm, V=200 kV, $\alpha=0.1$ mrad, and $\Delta E=0.8$ eV.

FIG. 2 is a graph showing a contrast transfer function CTF at a defocus of −2 μm. The function has been obtained as a result of a calculation performed under conditions where $C_s$=15 mm, $C_c$=2.0 mm, accelerating voltage V=200 kV, illumination angle α=0.1 mrad, and energy spread ΔE=0.8 eV.

It can be seen from FIG. 2 that where the imaging system 4 has a large spherical aberration coefficient $C_s$ and a small chromatic aberration $C_c$, attenuation of the contrast transfer function CTF due to the spatial envelope function as seen in FIG. 11 does not occur and that information about low spatial frequencies to information about high spatial frequencies can be transmitted.

In this way, if only the spherical aberration coefficient $C_s$ of the imaging system 4 is increased, attenuation of the contrast transfer function CTF due to the spatial envelope function at large amounts of defocus can be suppressed. However, with respect to the objective lens of a transmission electron microscope, it is difficult to design the objective lens such that it has a large spherical aberration coefficient $C_s$ (e.g., $C_s \geq 10$ mm) and a small chromatic aberration coefficient $C_c$ (e.g., $C_c \leq 2.0$ mm), for the following reason. If the spherical aberration coefficient $C_s$ of an objective lens is increased, the chromatic aberration coefficient $C_c$ will usually be increased to a similar degree.

If both spherical aberration coefficient $C_s$ and chromatic aberration coefficient $C_c$ increase, information about high spatial frequencies is impaired due to attenuation of the contrast transfer function CTF caused by the temporal envelope function at large amounts of defocus.

Figure 3:
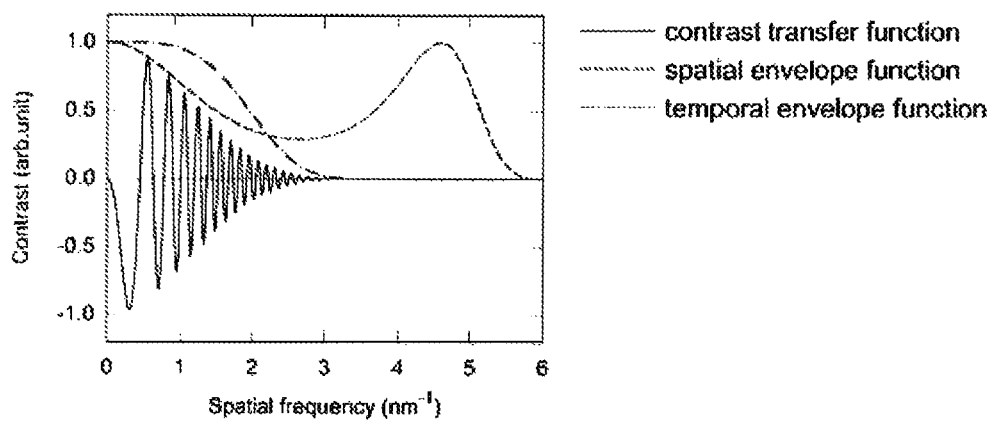
FIG. 3 is a graph showing a contrast transfer function at a defocus of −2 μm under conditions where $C_s=15$ mm, $C_c=10$ mm, V=200 kV, $\alpha=0.1$ mrad, and $\Delta E=0.8$ eV.

FIG. 3 is a graph showing a contrast transfer function CTF at a defocus of −2 μm. This function has been derived by a calculation performed under conditions where $C_s$=15 mm, $C_c$=10 mm, accelerating voltage V=200 kV, illumination angle α=0.1 mrad, and energy spread ΔE=0.8 eV.

It can be seen that if both spherical aberration coefficient $C_s$ and chromatic aberration coefficient $C_c$ are increased, attenuation of the contrast transfer function CTF due to the spatial envelope function does not occur as shown in FIG. 3 but the contrast transfer function CTF is attenuated by the temporal envelope function. As a consequence, information about high spatial frequencies is impaired.

As can be seen from Eq. (4), if the chromatic aberration coefficient $C_c$ is increased, the temporal envelope function decreases monotonously and so the chromatic aberration coefficient $C_c$ is preferably reduced to a minimum. In particular, the chromatic aberration coefficient $C_c$ is preferably between 0 mm and 2.0 mm, inclusively. Consequently, attenuation of the contrast transfer function CTF due to the temporal envelope function can be suppressed at high spatial frequencies. This can prevent information about high spatial frequencies from being impaired.

In this way, in order to prevent information about high spatial frequencies from being impaired, it is required that the spherical aberration coefficient $C_s$ of the imaging system 4 be large and the chromatic aberration coefficient $C_c$ be small. However, as described previously, it is difficult to design a TEM objective lens having a large spherical aberration coefficient $C_s$ and a small chromatic aberration coefficient $C_c$. Accordingly, in the present embodiment, the imaging system 4 having a large spherical aberration coefficient $C_s$ and a small chromatic aberration coefficient $C_c$ is accomplished by increasing the spherical aberration coefficient $C_s$ of the objective lens 40 by the use of the spherical aberration corrector 50.

In the spherical aberration corrector 50, the spherical aberration coefficient $C_s$ of the objective lens 40 is usually set small for the purpose of use. In the transmission electron microscope 100, however, the spherical aberration corrector 50 is used to increase the spherical aberration coefficient $C_s$ of the objective lens 40 of the imaging system 4.

Figure 4:
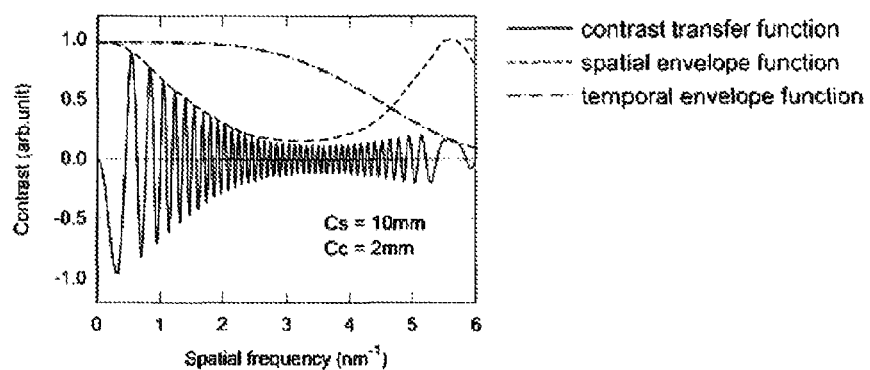
FIG. 4 is a graph showing a contrast transfer function at a defocus of −2 μm under conditions where $C_s=10$ mm, $C_c=2.0$ mm, V=200 kV, $\alpha=0.1$ mrad, and $\Delta E=0.8$ eV.
Figure 5:
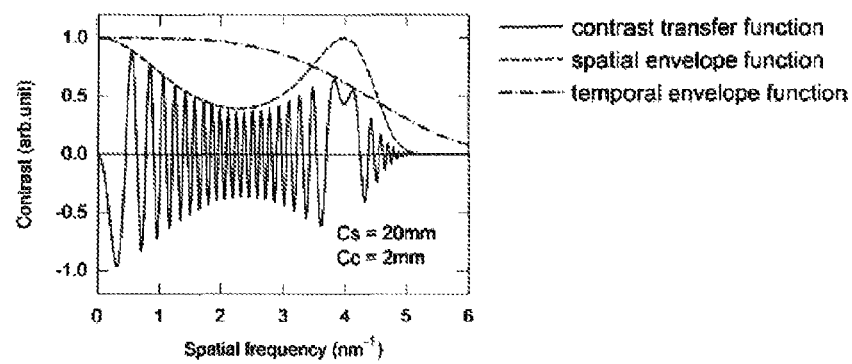
FIG. 5 is a graph showing a contrast transfer function at a defocus of −2 μm under conditions where $C_s=20$ mm, $C_c=2.0$ mm, V=200 kV, $\alpha=0.1$ mrad, and $\Delta E=0.8$ eV.
Figure 6:
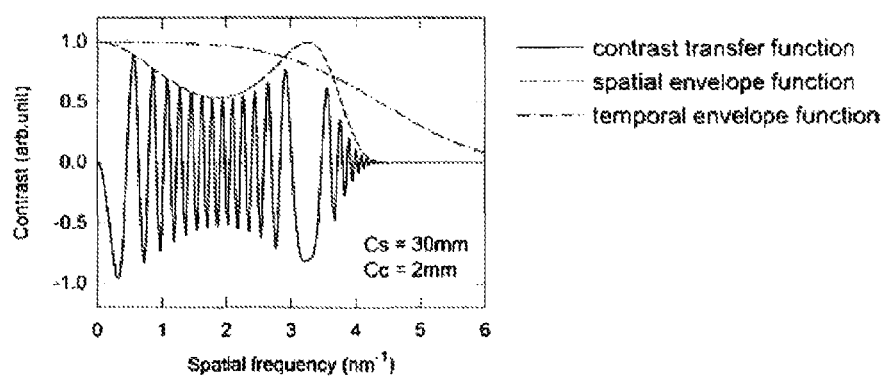
FIG. 6 is a graph showing a contrast transfer function at a defocus of −2 μm under conditions where $C_s=30$ mm, $C_c=2.0$ mm, V=200 kV, $\alpha=0.1$ mrad, and $\Delta E=0.8$ eV.

FIGS. 4-6 are graphs each showing a contrast transfer function CTF at a defocus of −2 μm. The contrast transfer function CTF shown in FIG. 4 shows the result of a calculation performed under the condition where $C_s$=10 mm. The contrast transfer function CTF shown in FIG. 5 shows the result of a calculation performed under the condition where $C_s$=20 mm. The contrast transfer function CTF shown in FIG. 6 shows the result of a calculation performed under the condition where $C_s$=30 mm. The other computational conditions (i.e., $C_c$=2.0 mm, accelerating voltage V=200 kV, illumination angle α=0.1 mrad, and energy spread ΔE=0.8 eV) for the contrast transfer functions CTF shown in FIGS. 4-6 are the same.

It can be seen from FIGS. 4-6 that when the spherical aberration coefficient $C_s$ is in the range from 10 mm to 30 mm, inclusively, attenuation of the contrast transfer function CTF due to a spatial envelope function is suppressed at large values of defocus.

If the value of the spherical aberration coefficient $C_s$ varies, the shape drawn by the spatial envelope function varies as shown in FIGS. 4-6. That is, even at the same spatial frequency, if the value of the spherical aberration coefficient $C_s$ varies, the degree of attenuation of the contrast transfer function CTF due to the spatial envelope function varies. Accordingly, it is desirable to be capable of modifying the value of the spherical aberration coefficient $C_s$ such that the imaging system 4 becomes adapted for the size of the structure or object under observation.

In the present embodiment, the spherical aberration coefficient $C_s$ of the objective lens 40 can be adjusted easily by the spherical aberration corrector 50. Therefore, in the present embodiment, the contrast transfer function CTF can be easily modified such that the imaging system becomes adapted to the size of the structure or object under observation.

Figure 7:
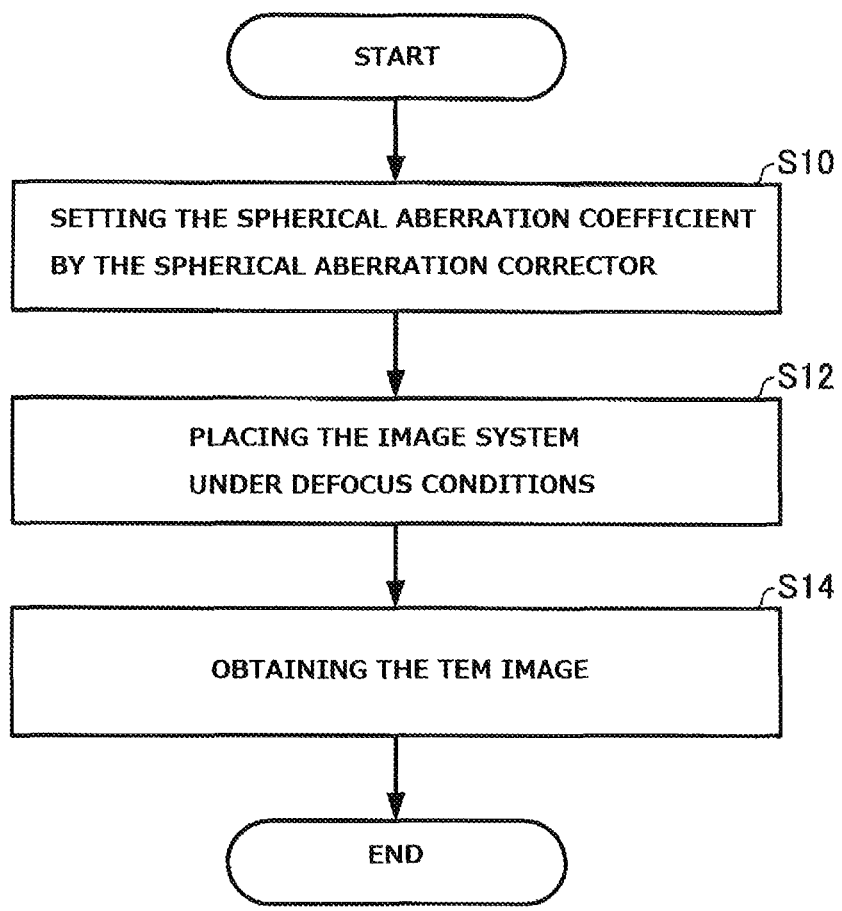
FIG. 7 is a flowchart illustrating one example of subroutine performed by the processor of the transmission electron microscope shown in FIG. 1.

An image acquisition method for use in the transmission electron microscope 100 associated with the first embodiment is next described by referring to FIG. 7, which is a flowchart illustrating one example of image acquisition subroutine performed by the processor 70 of the microscope 100.

First, the controller 72 controls the spherical aberration corrector 50 to set the spherical aberration coefficient $C_s$ of the objective lens 40, thus suppressing attenuation of the contrast transfer function due to the envelope function (S10). In particular, the controller 72 produces positive spherical aberration in the spherical aberration corrector 50 to increase the original spherical aberration coefficient $C_s$ (e.g., 1.0 mm) of the objective lens 40 that is not yet corrected by the spherical aberration corrector 50 to a given value (e.g., $C_s \geq 10$ mm). Consequently, the imaging system 4 having a large spherical aberration coefficient $C_s$ and a small chromatic aberration coefficient $C_c$ can be accomplished.

Then, the controller 72 controls the objective lens 40 to place the imaging system 4 including the objective lens 40 of the transmission electron microscope 100 under defocus conditions (S12). For example, the controller 72 makes the amount of defocus of the objective lens 40 greater than the Scherzer focus value. Consequently, as shown in FIG. 2, the imaging system 4 capable of transmitting from information about low spatial frequencies to information about high spatial frequencies can be accomplished. The amount of defocus can be appropriately set according to the size of the object or structure under observation.

The value of the spherical aberration coefficient $C_s$ used in step S10 and the amount of defocus used in step S12 may be previously stored, for example, in the storage portion 84. The value of the spherical aberration coefficient $C_s$ used at step S10 and the amount of defocus at step S12 may be set at will, for example, by the user. The user may set the value of the spherical aberration coefficient $C_s$ and the amount of defocus, for example, via the manual control portion 82.

In the subroutine described so far, step S12 is performed after step S10. No restriction is placed on the order in which these steps are carried out. Step S10 may be performed after step S12.

Then, the image acquisition portion 74 obtains information about the TEM image formed by the imaging system 4 under defocus conditions, the imaging system 4 having a large spherical aberration coefficient $C_s$ and a small chromatic aberration coefficient $C_c$ (S14). The information about the TEM image is delivered from the image pickup device 60. The image acquisition portion 74 generates a TEM image based on the obtained information about the TEM image. The image acquisition portion 74 generates a display signal from the generated image and displays the TEM image on the display unit 80. The processor 70 then terminates this subroutine.

The image acquisition method and transmission electron microscope associated with the present embodiment have the following features.

The image acquisition method associated with the present embodiment includes an operation for setting the spherical aberration coefficient $C_s$ of the imaging system 4 of the transmission electron microscope 100 to suppress attenuation of the contrast transfer function due to the envelope function and an operation for obtaining an image by the imaging system 4 placed under defocus conditions. As a result, as described previously, the imaging system 4 can be built such that it has a large spherical aberration coefficient $C_s$ and a small chromatic aberration coefficient $C_c$ (e.g., $C_s \geq 10$ mm and $C_c \leq 2.0$ mm). Even if the amount of defocus is increased, attenuation of the contrast transfer function due to the spatial envelope function can be suppressed. Consequently, even if the amount of defocus is increased, information about from low to high spatial frequencies in a wide frequency range can be obtained without impairing information about high spatial frequencies.

In the image acquisition method associated with the present embodiment, the spherical aberration coefficient $C_s$ is set using the spherical aberration corrector 50. This makes it easy to set the spherical aberration coefficient $C_s$ of the objective lens 40 of the imaging system 4. Accordingly, the contrast transfer function can be easily changed such that the imaging system becomes adapted to the size of the object or structure under observation.

In the image acquisition method associated with the present embodiment, the spherical aberration coefficient $C_s$ is set to 10 mm or more. The chromatic aberration coefficient $C_c$ is set to 2 mm or less. As a result, if the amount of defocus is increased, attenuation of the contrast transfer function due to the spatial envelope function can be suppressed as shown in FIGS. 4-6. Thus, if the amount of defocus is increased, information about high spatial frequencies is not impaired. Information about from low spatial frequencies to high spatial frequencies in a wide frequency range can be obtained.

In the transmission electron microscope 100 associated with the present embodiment, the controller 72 performs an operation for controlling the spherical aberration corrector 50 to set the spherical aberration coefficient $C_s$ of the imaging system 4 such that attenuation of the contrast transfer function due to an envelope function is suppressed and an operation for controlling the imaging system 4 to place the imaging system 4 under defocus conditions. Consequently, if the amount of defocus is increased, attenuation of the contrast transfer function due to a spatial envelope function can be suppressed. Therefore, it is possible to achieve an optical system capable of transmitting from information about low spatial frequencies to information about high spatial frequencies in a wide frequency range without impairing the information about high spatial frequencies if the amount of defocus is increased.

In this way, the imaging system 4 of the transmission electron microscope 100 associated with the present embodiment can avoid loss of information about high spatial frequencies when a large amount of defocus is introduced and, therefore, is advantageously used for samples that are required to be observed under conditions of large amount of defocus and large phase contrast. That is, this imaging system is advantageously used for observation of a biological sample embedded in ice. Especially, when a biological sample is reconstructed in three dimensions by single particle analysis, the imaging system is quite effective in improving the resolution.

2. Second Embodiment

2.1. Transmission Electron Microscope

Figure 8:
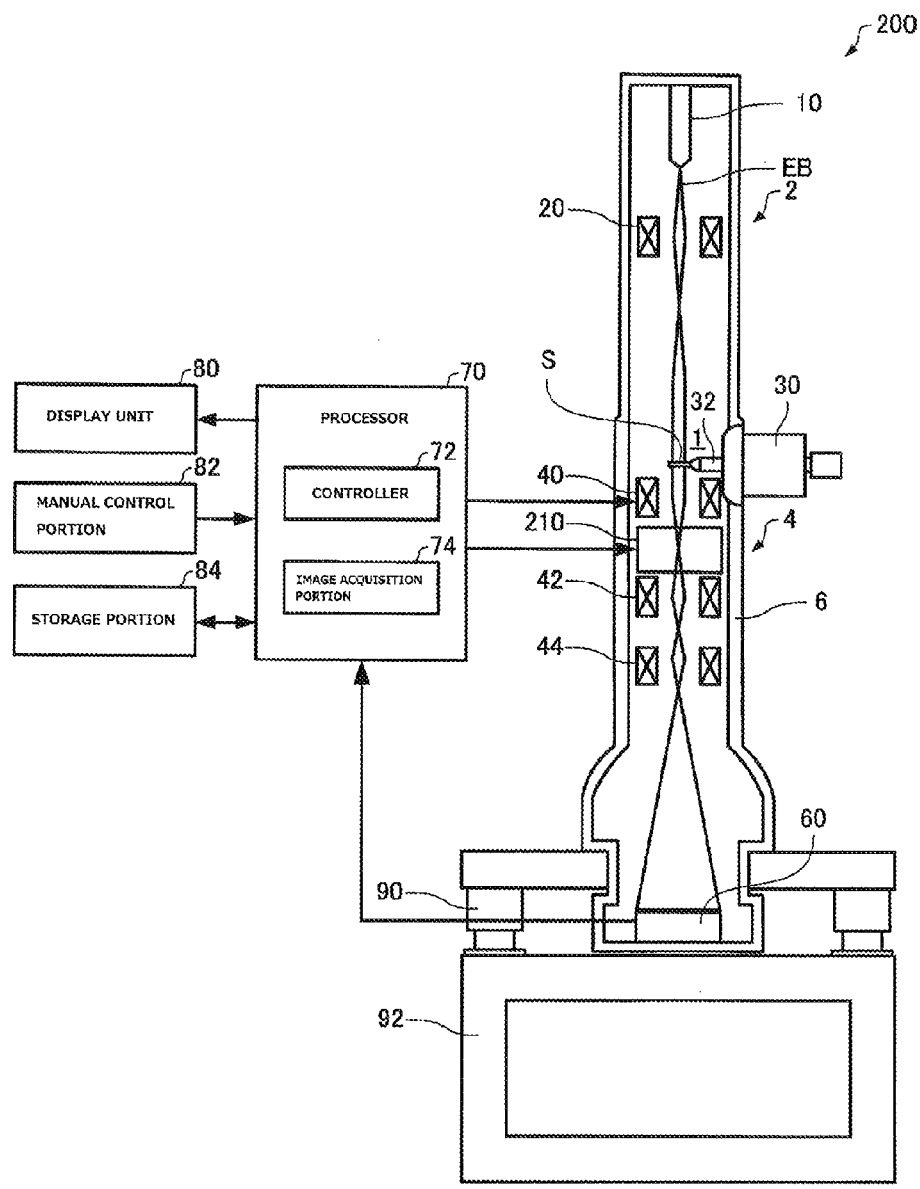
FIG. 8 is a vertical cross section partly in block form of a transmission electron microscope associated with a second embodiment of the present invention.

A transmission electron microscope associated with a second embodiment of the present invention is next described by referring to FIG. 8, which shows the configuration of this transmission electron microscope, 200. Those components of the transmission electron microscope 200 which are similar in function with their respective counterparts of the above-described transmission electron microscope 100 associated with the first embodiment are indicated by the same reference numerals as in the above cited figures and a description thereof is omitted.

As shown in FIG. 1, the above-described transmission electron microscope 100 has the spherical aberration corrector 50. The imaging system 4 having a large spherical aberration coefficient $C_s$ and a small chromatic aberration coefficient $C_c$ is built by setting the spherical aberration coefficient $C_s$ of the imaging system 4 by the use of the spherical aberration corrector 50. An optical system capable of transmitting information about a wide range of frequency range is realized.

In contrast, the transmission electron microscope 200 has a chromatic aberration corrector 210 as shown in FIG. 8. The imaging system 4 having a large spherical aberration coefficient $C_s$ and a small chromatic aberration coefficient $C_c$ is built by setting the chromatic aberration coefficient $C_c$ of the imaging system 4 by the use of the chromatic aberration corrector 210. An optical system capable of transmitting information about a wide range of frequency range is realized.

The spherical aberration coefficient $C_s$ and chromatic aberration coefficient $C_c$ of the objective lens 40 of the transmission electron microscope 200 have large values. In particular, in the transmission electron microscope 200, the spherical aberration coefficient $C_s$ and chromatic aberration coefficient $C_c$ of the objective lens 40 have values which are, for example, between 10 mm and 30 mm, inclusively.

A chromatic aberration corrector (also known as a $C_c$ corrector) 210 is disposed behind the objective lens 40. In the illustrated example, the chromatic aberration corrector 210 is disposed between the objective lens 40 and the intermediate lens 42. The chromatic aberration corrector 210 is mounted in the imaging system 4 of the transmission electron microscope 200.

The chromatic aberration corrector 210 varies the chromatic aberration coefficient $C_c$ of the imaging system 4 of the transmission electron microscope 200. For example, the corrector 210 varies the chromatic aberration coefficient $C_c$ of the objective lens 40. The chromatic aberration corrector 210 is configured, for example, including a multipole lens. The corrector 210 can produce chromatic aberration by the multipole lens to reduce the chromatic aberration coefficient $C_c$ of the objective lens 40. In particular, the chromatic aberration corrector 210 produces negative chromatic aberration, thus reducing the chromatic aberration coefficient $C_c$ of the objective lens 40.

2.2. Image Acquisition Method

A TEM image acquisition method associated with the second embodiment is next described below. Only the differences with the above-described TEM image acquisition method associated with the first embodiment are described. A description of similarities is omitted.

The principle of the TEM image acquisition method associated with the second embodiment is first described.

In the present embodiment, the imaging system 4 having a large spherical aberration coefficient $C_s$ and a small chromatic aberration coefficient $C_c$ (for example, $C_s \leq 10$ mm and $C_c \leq 2.0$ mm) is built using the chromatic aberration corrector 210. Thus, an imaging system is achieved which can transmit from information about low spatial frequencies to information about high spatial frequencies without impairing the information about the high spatial frequencies if the amount of defocus is made greater than the Scherzer focus value.

It is difficult to design a TEM objective lens such that it has a large spherical aberration coefficient $C_s$ and a small chromatic aberration coefficient $C_c$ as described in connection with the first embodiment. However, in the present embodiment, the imaging system 4 having a large spherical aberration coefficient $C_s$ and a small chromatic aberration coefficient $C_c$ is accomplished by presetting the spherical aberration coefficient $C_s$ and chromatic aberration coefficient $C_c$ of the objective lens 40 to large values (e.g., $C_s \geq 10$ mm and $C_c \geq 10$ mm) and setting the chromatic aberration coefficient $C_c$ to a small value (e.g., $0 \leq C_c \leq 2.0$ mm) by the use of the chromatic aberration corrector 210.

Figure 9:
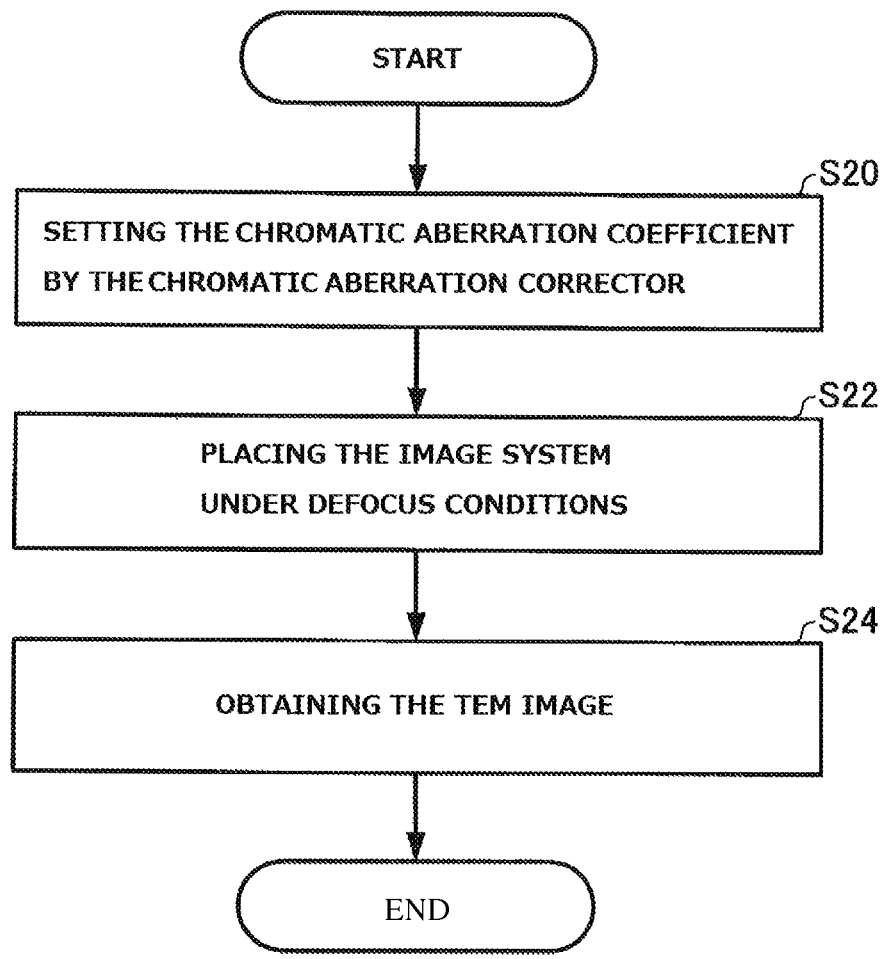
FIG. 9 is a flowchart illustrating one example of subroutine performed by the processor of the transmission electron microscope shown in FIG. 8.
Figure 10:
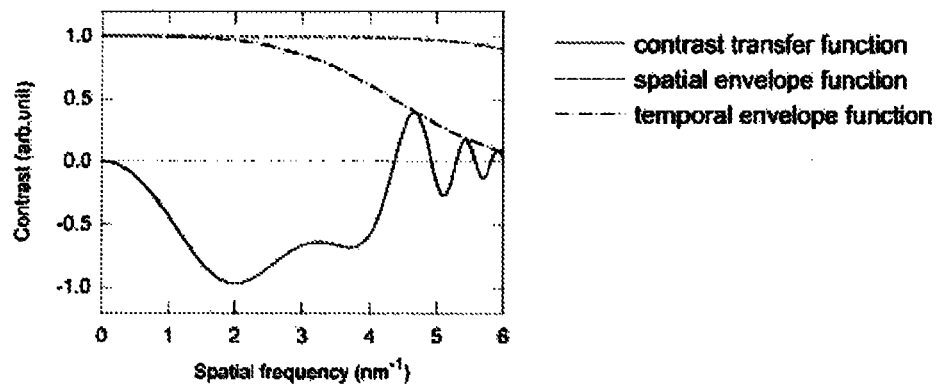
FIG. 10 is a graph showing a contrast transfer function at the Scherzer focus under conditions where $C_s=1.0$ mm, $C_c=2.0$ mm, V=200 kV, $\alpha=0.1$ mrad, and $\Delta E=0.8$ eV.

An image acquisition method implemented in the transmission electron microscope 200 associated with the second embodiment is next described by referring to FIG. 9, which is a flowchart illustrating one example of image acquisition subroutine performed by the processor 70 of the microscope 200.

First, the controller 72 controls the chromatic aberration corrector 210 to set the chromatic aberration coefficient $C_c$ of the objective lens 40, for suppressing attenuation of the contrast transfer function due to the envelope function (S20). In particular, the controller 72 produces negative chromatic aberration in the chromatic aberration corrector 210 to reduce the original chromatic aberration coefficient $C_c$ (e.g., $C_c \geq 10$ mm) of the objective lens 40, which is not yet corrected by the corrector 210, up to a given value (e.g., $0 \leq C_c \leq 2.0$ mm). Consequently, the imaging system 4 having a large spherical aberration $C_s$ and a small chromatic aberration coefficient $C_c$ can be accomplished.

Then, the controller 72 controls the objective lens 40 such that the imaging system 4 (especially, the objective lens 40) of the transmission electron microscope 200 is placed under defocus conditions (S22). For example, the controller 72 makes the amount of defocus of the objective lens 40 greater than the Scherzer focus value. Consequently, as shown in FIG. 2, the imaging system 4 capable of transmitting from information about low spatial frequencies to information about high spatial frequencies can be accomplished. The amount of defocus can be appropriately set according to the size of the structure or object under observation.

The value of the chromatic aberration coefficient $C_c$ used in step S20 and the amount of defocus used at step S22 may be previously stored in the storage portion 84. The value of the chromatic aberration coefficient $C_c$ used in step S20 and the amount of defocus used at step S22 may be set, for example, by a user. The user may set the value of the chromatic aberration coefficient $C_c$ and the amount of defocus, for example, via the manual control portion 82.

In the subroutine described so far, step S22 is performed after step S20. No restriction is placed on the order in which these steps are carried out. For example, step S20 may be performed after step S22.

Then, the image acquisition portion 74 obtains information about a TEM image formed by the imaging system 4 which has a large spherical aberration coefficient $C_s$ and a small chromatic aberration coefficient $C_c$ and which is placed under defocus conditions (S24). The information about the TEM image is delivered from the image pickup device 60. The image acquisition portion 74 generates a TEM image based on the obtained information about the TEM image. The image acquisition portion 74 generates a display signal, for example, from the generated image and displays the TEM image on the display unit 80. Then, the processor 70 terminates the subroutine.

The image acquisition method and transmission electron microscope associated with the present embodiment have the following features.

The image acquisition method associated with the present embodiment involves an operation for setting the chromatic aberration coefficient $C_c$ of the imaging system 4 of the transmission electron microscope 200 to suppress attenuation of the contrast transfer function due to the envelope function and an operation for obtaining an image by the imaging system 4 placed under defocus conditions. Consequently, it is possible to build the imaging system 4 such that it has a large spherical aberration coefficient $C_s$ and a small chromatic aberration coefficient $C_c$ (e.g., $C_s \geq 10$ mm and $C_c \leq 2.0$ mm) as described previously. Even if the amount of defocus is increased, attenuation of the contrast transfer function due to the spatial envelope function can be suppressed. Hence, even if the amount of defocus is increased, information about high spatial frequencies is not impaired. Information about a wide range of spatial frequencies from low to high spatial frequencies can be obtained.

In the image acquisition method associated with the present embodiment, the chromatic aberration coefficient $C_c$ is set using the chromatic aberration corrector 210 for varying the chromatic aberration coefficient $C_c$. Consequently, the chromatic aberration coefficient $C_c$ of the objective lens 40 of the imaging system 4 can be easily set. This permits the contrast transfer function to be varied readily such that the imaging system becomes adapted to the size of the structure or object under observation.

In the transmission electron microscope 200 associated with the present embodiment, the controller 72 performs an operation for controlling the chromatic aberration corrector 210 to set the chromatic aberration coefficient $C_c$ of the imaging system such that attenuation of the contrast transfer function due to the envelope function is suppressed and an operation for controlling the imaging system 4 such that the imaging system 4 is placed under defocus conditions. This permits attenuation of the contrast transfer function due to the spatial envelope function to be suppressed if the amount of defocus is large. Consequently, if the amount of defocus is increased, information about high spatial frequencies is not impaired. An optical system capable of transmitting from information about low spatial frequencies to information about high spatial frequencies can be accomplished.

Furthermore, the transmission electron microscope 200 associated with the present embodiment can increase the spherical aberration coefficient $C_s$ of the objective lens 40 and the original value of the chromatic aberration coefficient $C_c$ of the objective lens 40 that is not yet corrected by the chromatic aberration corrector 210. For example, $C_s \geq 10$ mm and $C_c \geq 10$ mm. Therefore, the polepiece gap of the objective lens 40 can be increased. This results in a spatial allowance around the sample S, facilitating mounting of a detector (such as an EDS (energy-dispersive X-ray spectroscopy) detector) or optics.

It is to be understood that the present invention is not restricted to the above embodiments and modifications and that they can be modified variously within the scope and spirit of the invention.

For example, in the above-described transmission electron microscope 100 shown in FIG. 1, the imaging system 4 having a large spherical aberration coefficient $C_s$ and a small chromatic aberration coefficient $C_c$ is achieved by the use of the spherical aberration corrector 50. In the above-described transmission electron microscope 200 shown in FIG. 8, the imaging system 4 having a large spherical aberration coefficient $C_s$ and a small chromatic aberration coefficient $C_c$ is achieved by the use of the chromatic aberration corrector 210. On the other hand, a transmission electron microscope may be configured including both spherical aberration corrector 50 and spherical aberration corrector 210. In this case, the imaging system 4 having a large spherical aberration coefficient $C_s$ and a small chromatic aberration coefficient $C_c$ may be achieved by setting both spherical aberration coefficient $C_s$ and chromatic aberration coefficient $C_c$ of the imaging system 4 of the transmission electron microscope.

The transmission electron microscope already described in connection with FIG. 1 can have plural optical systems which are different in spherical aberration coefficient $C_s$. Plural TEM images are taken by these optical systems under Scherzer focus conditions. The TEM images are superimposed to create one image.

More specifically, electron microscope images are taken under Scherzer focus conditions and in three operative conditions. In a first one of these three operative conditions, the spherical aberration coefficient $C_s$ of the imaging system 4 is reduced, for example, to 0.5 mm by the use of the spherical aberration corrector 50. In a second operative condition, the spherical aberration coefficient $C_s$ of the imaging system 4 is increased, for example, to 30 mm by the use of the spherical aberration corrector 50. In a third operative condition, the objective lens 40 is deactivated, only the objective minilens (not shown) is used, and $C_s$ is 3,000 mm. These electron microscope images are superimposed. In consequence, an image can be derived from a contrast transfer function that does not vibrate over a wide frequency range from a low spatial frequency to a high spatial frequency, because if the spherical aberration coefficient $C_s$ is increased, a contrast transfer function that does not vibrate in a low spatial frequency range under the Scherzer focus conditions is obtained.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:

1. An image acquisition method for use in a transmission electron microscope, said image acquisition method comprising the steps of:

setting at least one of a spherical aberration coefficient and a chromatic aberration coefficient of an imaging system of the transmission electron microscope to suppress attenuation of a contrast transfer function due to an envelope function; and obtaining an image by the imaging system placed under defocus conditions, wherein the spherical aberration coefficient of said imaging system is varied by the use of a spherical aberration corrector, and wherein the chromatic aberration coefficient of said imaging system is varied by the use of a chromatic aberration corrector.

2. The image acquisition method as set forth in claim 1, wherein the spherical aberration coefficient of said imaging system is set to 10 mm or more, and wherein the chromatic aberration coefficient of the imaging system is set to 2 mm or less.

3. A transmission electron microscope comprising:
an electron beam source for producing an electron beam;
an illumination system for causing the electron beam released from the electron beam source to be directed at a sample;
an imaging system for focusing the electron beam transmitted through the sample;
a spherical aberration corrector for varying a spherical aberration coefficient of the imaging system; and
a controller for controlling the imaging system and the spherical aberration corrector,
wherein the controller performs an operation for controlling the spherical aberration corrector to set the spherical aberration coefficient of the imaging system such that attenuation of a contrast transfer function due to an envelope function is suppressed and an operation for controlling the imaging system to place the imaging system under defocus conditions.

4. A transmission electron microscope comprising:
an electron beam source for producing an electron beam;
an illumination system for causing the electron beam released from the electron beam source to be directed at a sample;
an imaging system for focusing the electron beam transmitted through the sample;
a chromatic aberration corrector for varying a chromatic aberration coefficient of the imaging system; and
a controller for controlling the imaging system and the chromatic aberration corrector,
wherein the controller performs an operation for controlling the chromatic aberration corrector to set the chromatic aberration coefficient of the imaging system such that attenuation of a contrast transfer function due to an envelope function is suppressed and an operation for controlling the imaging system to place the imaging system under defocus conditions.

* * * * *